United States Patent [19]

Shimoda et al.

[11] Patent Number: 5,498,501
[45] Date of Patent: Mar. 12, 1996

[54] EXPOSURE METHOD

[75] Inventors: Isamu Shimoda, Zama; Takao Kariya, Hino; Nobutoshi Mizusawa, Yamato; Kunitaka Ozawa, Isehara; Shunichi Uzawa, Nakamachi, all of Japan

[73] Assignee: Canon Kabushiki Kaisha, Tokyo, Japan

[21] Appl. No.: 416,503

[22] Filed: Apr. 4, 1995

Related U.S. Application Data

[63] Continuation of Ser. No. 161,670, Dec. 6, 1993, abandoned, which is a continuation of Ser. No. 648,991, Jan. 31, 1991, abandoned.

[30] Foreign Application Priority Data

Feb. 2, 1990 [JP] Japan ................................ 2-022269
Feb. 6, 1990 [JP] Japan ................................ 2-025071

[51] Int. Cl.$^6$ .................................................. G03F 9/00
[52] U.S. Cl. ................... 430/22; 430/5; 430/311; 430/312; 355/53; 250/491.1; 437/8
[58] Field of Search .................... 430/5, 22, 311, 430/312; 355/53; 250/491.1; 437/8

[56] References Cited

U.S. PATENT DOCUMENTS

| | | | |
|---|---|---|---|
| 4,475,811 | 10/1984 | Brunner ........................................ | 430/22 |
| 4,676,630 | 6/1987 | Matsushita et al. ......................... | 355/53 |
| 4,734,746 | 3/1988 | Ushida et al. ................................ | 355/53 |
| 4,812,661 | 3/1989 | Owen ........................................... | 250/491.1 |
| 4,906,326 | 3/1990 | Amemiya et al. ............................ | 430/5 |
| 4,998,134 | 3/1991 | Isohata et al. ................................ | 355/53 |
| 5,008,703 | 4/1991 | Kawakami et al. .......................... | 355/53 |
| 5,087,537 | 2/1992 | Conway et al. .............................. | 430/22 |

FOREIGN PATENT DOCUMENTS 3727453   3/1988   Germany.

OTHER PUBLICATIONS

IBM Technical Disclosure Bulletin, vol. 29, No. 6, Nov. 1986.
Deguchi, et al., "Step-and-Repeat X-Ray/Photo Hybrid Lithography for 0.3–μm MOS Devices," IEEE Transactions on Electron Devices, vol. ED/34, No. 4, Apr. 1987, pp. 759 through 764.

*Primary Examiner*—Mark Chapman
*Attorney, Agent, or Firm*—Fitzpatrick, Cella, Harper & Scinto

[57] ABSTRACT

A method of manufacturing of semiconductor devices, includes exposing different portions of a semiconductor substrate with a first exposure apparatus having a first exposure range; placing and aligning the semiconductor substrate with respect to a second exposure range of a second exposure apparatus, which range is larger than the first exposure range of the first exposure apparatus; detecting an alignment error of each of the portions of the semiconductor substrate as covered by the second exposure range of the second exposure apparatus; calculating an overall alignment error of those portions of the semiconductor substrate with respect to the entire second exposure range of the second exposure apparatus, on the basis of the detected alignment errors; and controlling the exposure operation of the second exposure apparatus on the basis of the calculated overall alignment error.

25 Claims, 11 Drawing Sheets

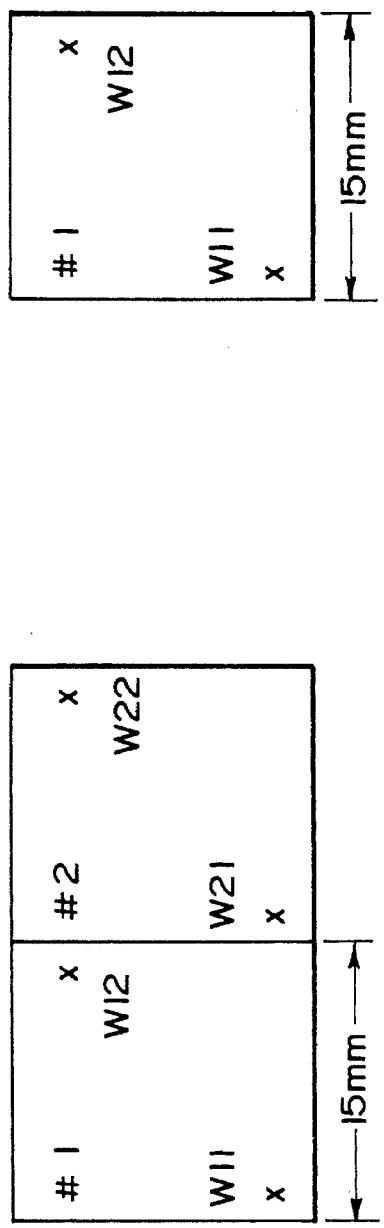
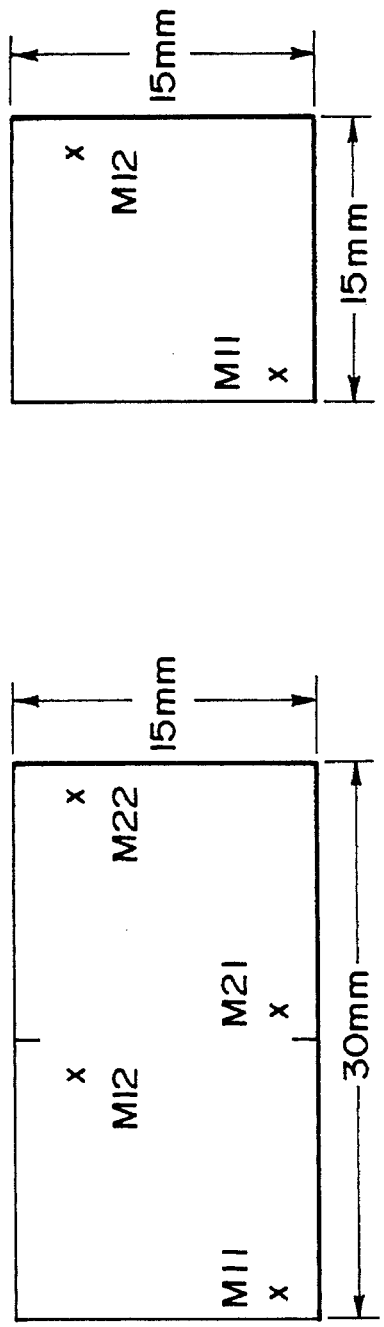

WAFER PATTERN

MASK PATTERN

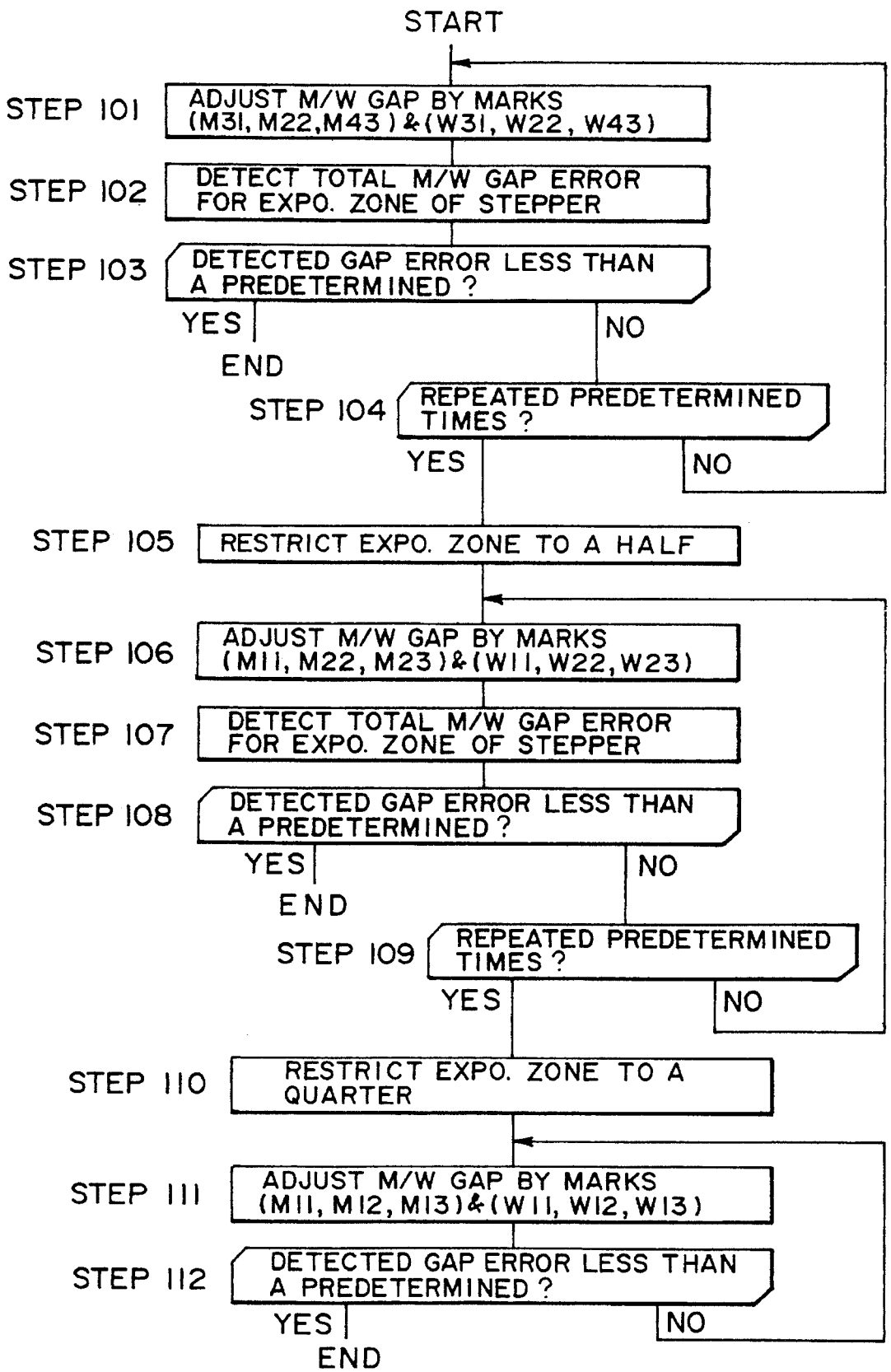
F I G. 9

WAFER PATTERN

MASK PATTERN

WAFER PATTERN

MASK PATTERN

| | |
|---|---|
| #1      x<br>    W12<br>W11   W13<br>x        x | #2      x<br>    W22<br>W21   W23<br>x        x |
| #3      x<br>    W32<br>W31   W33<br>x        x | #4      x<br>    W42<br>W41   W43<br>x        x |

|←— 15mm —→|

FIG. 15A
WAER PATTERN

```
          x              x
        M12            M22
M11    M13   M21      M23
 x       x    x         x
              +
         x              x
        M32            M42
M31    M33   M41      M43
 x       x    x         x
```

|←———— 30mm ————→|

FIG. 15B
MASK PATTERN

EXPOSURE METHOD

This application is a continuation of prior application, Ser. No. 08/161,670 filed Dec. 6, 1993, which application is a continuation of prior application, Ser. No. 07/648,991 filed Jan. 31, 1991, both now abandoned.

FIELD OF THE INVENTION AND RELATED ART

This invention relates to an exposure method suitably usable in the production of fine patterns for manufacturing semiconductor devices. More particularly, the invention is concerned with an exposure method for sequentially exposing different portions (shot areas) of a semiconductor wafer to a mask to thereby print a pattern of the mask upon the shot areas of the wafer.

In a step-and-repeat type exposure apparatus, different shot areas of a semiconductor wafer are exposed sequentially to a mask (reticle), by which a circuit pattern formed on the mask is transferred to the shot areas of the wafer. As a radiation source for photolithographically exposing a wafer, some types of exposure apparatuses use X-rays contained in synchrotron radiation, for example (hereinafter, this type of an exposure apparatus will be referred to as an "X-ray stepper"), and some other ones use ultraviolet light such as, for example, g-line light or i-line light produced by an ultra-high voltage Hg lamp or, alternatively, laser light produced by a laser source such as an excimer laser (hereinafter, this type of an exposure apparatus will be referred to as an "optical stepper").

As for the X-ray stepper, it is not easy to manufacture such a reduction projection lens system which is sufficiently practical for the use of X-rays. Although some X-ray steppers of reduction projection exposure type have been proposed, generally unit-magnification exposure is adopted wherein a mask and a wafer are placed opposed to each other with a small gap maintained therebetween. As is known in the art, X-ray lithography is suited for the production of extraordinarily fine patterns.

As for the optical stepper, on the other hand, a reduction projection lens system having satisfactory performance to a particular light, to be used, can be manufactured relatively easily. Therefore, reduction projection exposure is widely used. In the reduction projection exposure, the width and precision of a pattern to be prepared on a mask or reticle can be wide as compared with those of a pattern which is to be actually printed on a wafer. Thus, there is an advantage of ease in manufacture of the mask or reticle.

SUMMARY OF THE INVENTION

The manufacture of semiconductor integrated circuits or semiconductor devices includes about ten to twenty exposure processes for one semiconductor wafer. Each exposure process is executed by an exposure apparatus having a performance that satisfies required alignment precision and required linewidth precision for the pattern to be printed with that process. Also, for selection of such an exposure apparatus, the productivity or cost of the apparatus should be considered.

It is a primary object of the present invention to provide an exposure method by which enhanced productivity or reduction in cost of an exposure apparatus is assured.

In accordance with an aspect of the present invention, there is provided a method of manufacturing semiconductor devices, comprising the steps of: exposing different portions of a semiconductor substrate with a first exposure apparatus having a first exposure range; placing and aligning the semiconductor substrate with respect to a second exposure range of a second exposure apparatus, which range is larger than the first exposure range of the first exposure apparatus; detecting an alignment error of each of the portions of the semiconductor substrate as covered by the second exposure range of the second exposure apparatus; calculating an overall alignment error of those portions of the semiconductor substrate with respect to the entire second exposure range of the second exposure apparatus, on the basis of the detected alignment errors; and controlling the exposure operation of the second exposure apparatus on the basis of the calculated overall alignment error.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic and diagrammatic views of a first exposure apparatus having a particular exposure range and a second exposure apparatus having a larger exposure range to which the present invention is applied, wherein FIG. 1A shows an optical stepper, for example, and FIG. 1B shows an X-ray stepper, for example.

FIGS. 3A and 3B are schematic representations of wafer and mask patterns, on an occasion when in the FIG. 2 embodiment the exposure range of the second exposure apparatus is restricted to a half.

FIGS. 4A and 4B are schematic representations of wafer and mask patterns, on an occasion when in the FIG. 2 embodiment the exposure range of the second exposure apparatus is restricted to a quarter.

FIG. 9 is a flow chart, for explaining details of an exposure method according to another embodiment of the present invention.

FIGS. 15A and 15B are schematic representations of wafer and mask patterns which can be used in the second exposure apparatus, in the embodiment of FIG. 9.

DESCRIPTION OF THE PREFERRED EMBODIMENTS

Figure 8A:
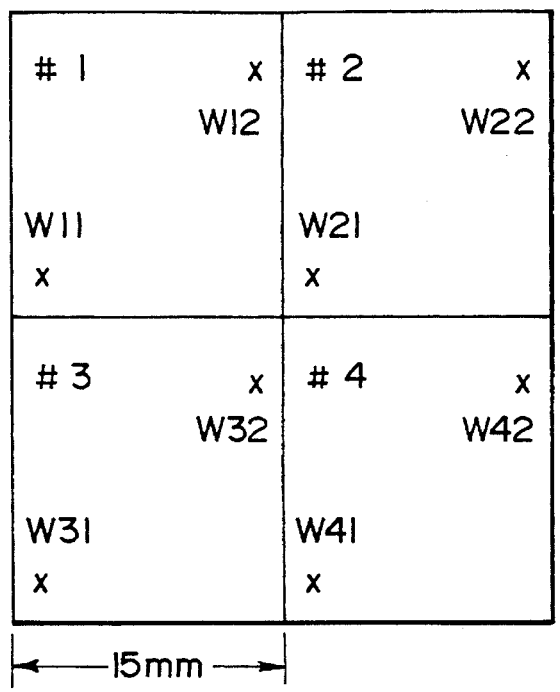
FIGS. 8A and 8B are wafer and mask patterns which can be used in the second exposure apparatus of the FIG. 2 embodiment.
Figure 8B:
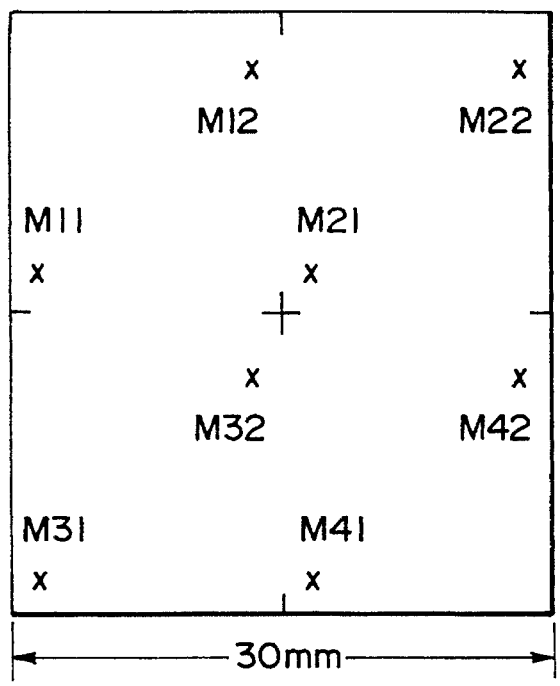

Generally, due to the limitation resulting from the projection range of a reduction projection lens, current optical steppers have a range to be exposed by a single shot (i.e. exposure range), of a size of about 15–20 mm square. On the other hand, X-ray steppers generally have a wider exposure range of about 30 mm square, at the maximum. It is now assumed that a first pattern of a first mask is printed on a layer of a semiconductor wafer by using a first exposure apparatus such as an optical stepper described above, having an exposure range (per one shot) of a size of 15 mm square and that, after predetermined treatment, a second pattern of a second mask is printed on the next layer of the wafer by using a second exposure apparatus such as an X-ray stepper described above, having an exposure range (per one shot) of a size of 30 mm square. Referring to FIGS. 8A and 8B, this example will be explained in detail. It is also assumed that the size of each semiconductor device to be formed on the wafer is 15 mm square which is equal to the size of the exposure range per one shot of the first exposure apparatus.

In the following description, reference character M denotes an alignment pattern formed on a mask, and reference character W denotes an alignment pattern formed on a wafer. The suffixes denote the order of disposition of semiconductor devices (hereinafter "semiconductor chips") formed on the wafer as well as that of the alignment patterns. For example, reference character W21 denotes a first alignment pattern of the second semiconductor chip of the wafer, and reference character M21 denotes an alignment pattern of the mask corresponding to the alignment pattern W21. In FIG. 8A, each wafer pattern printed by the first exposure apparatus has a size of 15 mm square and, therefore, four semiconductor chips can be arrayed in the exposure range of the second exposure apparatus. Accordingly, within the exposure range of the second exposure apparatus, four sets of alignment patterns #1 (W11, W12), #2 (W21, W22), #3 (W31, W32) and #4 (W41, W42) are present.

FIG. 8B shows alignment patterns of a mask to be used with the second exposure apparatus. Similarly, the mask to be used with the second exposure apparatus has four sets of alignment patterns #1 (M11, M12), #2 (M21, M22), #3 (M31, M32) and #4 (M41, M42). If only the second exposure apparatus, for example, is used so that all the exposure processes are executed with the same exposure range, it is sufficient that a mask to be used with the second exposure apparatus is equipped with one set of alignment patterns. However, if the first exposure apparatus is to be used additionally, the provision of four sets of alignment patterns is necessary. This will be readily understood, by taking into account a case wherein the first exposure apparatus is used after the second exposure apparatus is used.

Figure 7:
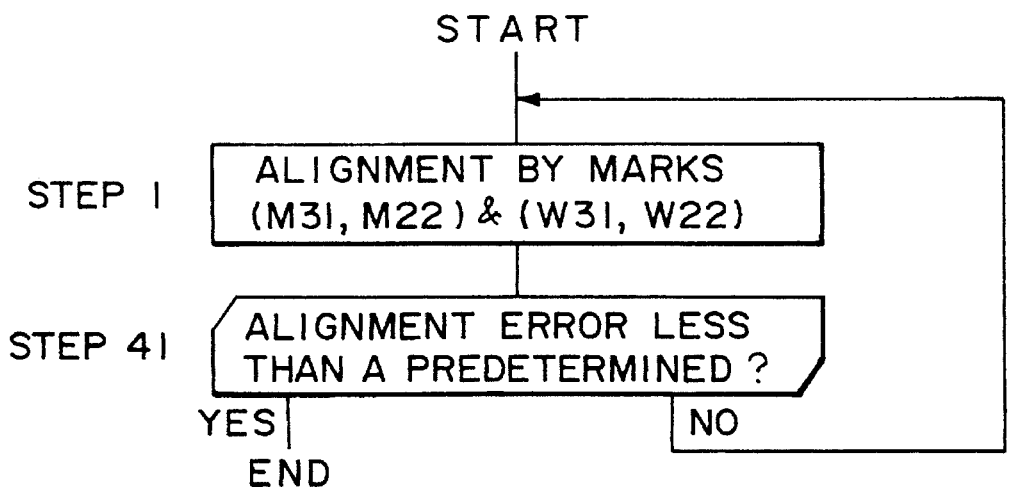
FIG. 7 is a flow chart, generally illustrating the alignment operation.

Referring to the flow chart of FIG. 7, the alignment process will be explained. As an example, the mask alignment patterns M31 and M22 and the wafer alignment patterns W31 and W22 are used. At step 1, by using the alignment patterns M31, M22, W31 and W22 and by using an alignment system (not shown), the mask-to-wafer alignment process is executed. At step 2, discrimination is made as to whether the remaining alignment error is less than a predetermined error or not. If not, the sequence goes back to step 1, and the alignment process is repeated. If the alignment error is less than the predetermined, the alignment process is finished.

With the alignment process described above, during the alignment error detection, all the alignment errors of the second pattern with respect to all of the four first patterns (each providing a semiconductor chip) are not detected. For this reason, there is a possibility that the printed second pattern is largely deviated from any one of the four first patterns.

In one preferred form of the present invention, it is possible to ensure desired positional precision in pattern printing, with regard to all the zones (shot areas) of the wafer.

More specifically, in this aspect of the present invention, the semiconductor device manufacturing process is executed by using a first exposure apparatus and a second exposure apparatus having a wider exposure range, wherein, when the wafer is to be exposed through the second exposure apparatus, the alignment error measurement can be made selectively with regard to each zone having the same size as that of the exposure range of the first exposure apparatus or with regard to each zone having a size equal to a multiple, by an integer, of the exposure range of the first exposure apparatus.

If the alignment error measured with respect to the exposure range of the second exposure apparatus, after repetitions of the alignment process, does not become smaller than a predetermined error, the exposure range of the second exposure apparatus may be reduced stepwise.

Referring now to FIGS. 15A and 15B, description will be made of adjustment of the interval between a mask and a wafer (hereinafter "M/W interval") on an occasion when first and second exposure apparatuses having different exposure ranges are used.

Character M denotes an M/W interval adjustment pattern of a mask, while character W denotes an M/W interval adjustment pattern of a wafer. The suffixes denote the order of disposition of semiconductor chips formed on the wafer as well as that of the M/W interval adjustment patterns. For example, reference character W21 denotes a first M/W interval adjustment pattern of a second semiconductor chip on the wafer, and reference character M21 denotes an M/W interval adjustment pattern of the mask corresponding to the alignment pattern W21.

In this example, as shown in FIG. 15A, each wafer pattern printed on the wafer by the first exposure apparatus has a size of 15 mm square and, therefore, four semiconductor chips are arrayed in the exposure range of the second exposure apparatus. Namely, within the exposure range of the second exposure apparatus, four sets of M/W interval adjustment patterns #1 (W11, W12, W13), #2 (W21, W22, W23), #3 (W31, W32, W33) and #4 (W41, W42, W43) are present on the wafer. FIG. 15B shows M/W interval adjustment patterns of a mask to be used with the second exposure apparatus. Similarly, this mask is equipped with four sets of M/W interval adjustment patterns #1 (M11, M12, M13), #2 (M21, M22, M23), #3 (M31, M32, M33) and #4 (M41, M42, M43). If only the second exposure apparatus, for example, is used so that all the exposure processes are executed with the same exposure range, it is sufficient that the mask to be used with the second exposure apparatus is equipped with one set of M/W interval adjustment patterns. However, if the first exposure apparatus is to be used additionally, the provision of four sets of patterns is necessary. This will be readily understood, by taking into account a case wherein the first exposure apparatus is used after the second exposure apparatus is used.

Figure 14:
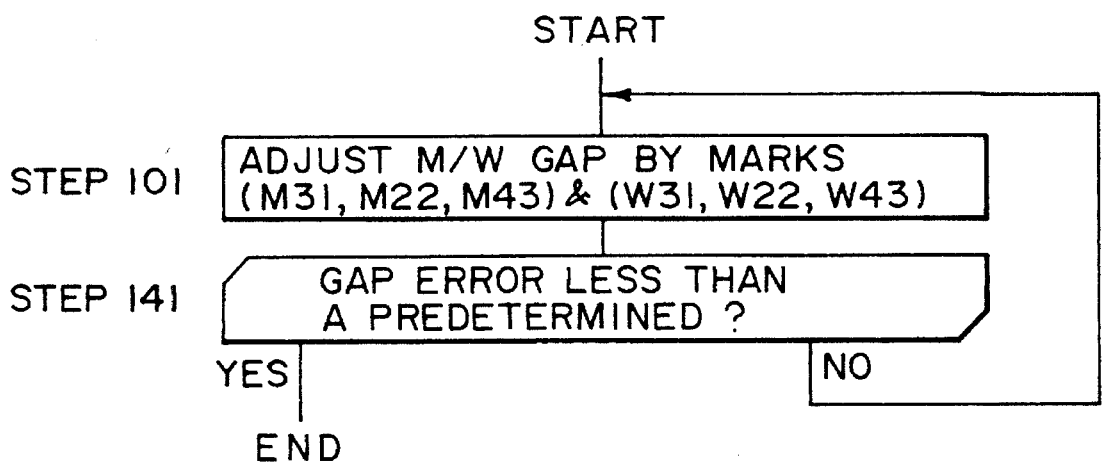
FIG. 14 is a flow chart, generally illustrating the mask-to-wafer spacing adjustment.

Referring now to the flow chart of FIG. 14, the mask-to-wafer interval adjustment process will be explained. As an example, the M/W interval adjustment patterns M31, M22, M43; W31, W22 and W43 of the mask and the wafer are used. At step 101, by using the patterns M31, M22, M43; W31, W22 and W43 and by using an interval adjusting system (not shown), the mask-to-wafer interval is adjusted. At step 41, after the adjustment, discrimination is made as to whether the remaining error in the mask-to-wafer interval is less than a predetermined error or not. If not, the sequence goes back to step 101, and the interval adjustment process is repeated. If the remaining error is less than the predetermined, the adjustment process is finished.

With the M/W interval adjustment process described above, during the interval error detection, all the mask-to-wafer interval errors of the second pattern with respect to all of the four first patterns (each providing a semiconductor chip) are not detected. For this reason, there is a possibility that the second pattern is largely defocused on any one of the four first patterns.

In another preferred from of the present invention, it is possible to ensure desired M/W interval adjustment precision in pattern printing, to all the zones (shot areas) of the wafer.

More specifically, in this aspect of the present invention, the semiconductor device manufacturing process is executed by using a first exposure apparatus and a second exposure apparatus having a wider exposure range, wherein, when a wafer is to be exposed through the second exposure apparatus, the M/W interval adjustment error measurement can be made selectively with regard to each zone of the same size as that of the exposure range of the first exposure apparatus or with regard to each zone which is equal to a multiple, by an integer, of the exposure range of the first exposure apparatus.

If the M/W interval adjustment error measured with regard to the exposure range of the second exposure apparatus, after repetitions of the M/W interval adjustment process, does not become less than a predetermined, the exposure range of the second exposure apparatus may be reduced stepwise.

In these aspects of the present invention, the semiconductor device manufacturing process can be executed by using a first exposure apparatus and a second exposure apparatus having a wider exposure range, while the alignment error and/or the M/W interval adjustment error of each semiconductor chip included in the exposure range of the second exposure apparatus can be minimized.

Figure 1A:
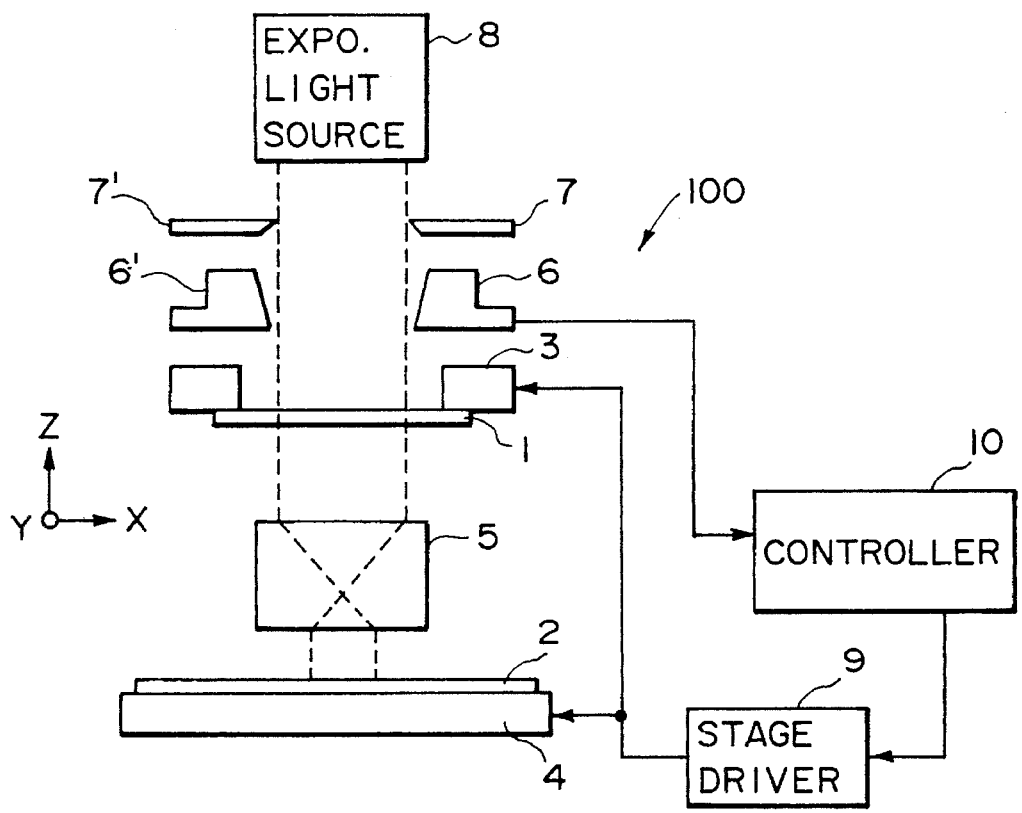
Figure 1B:
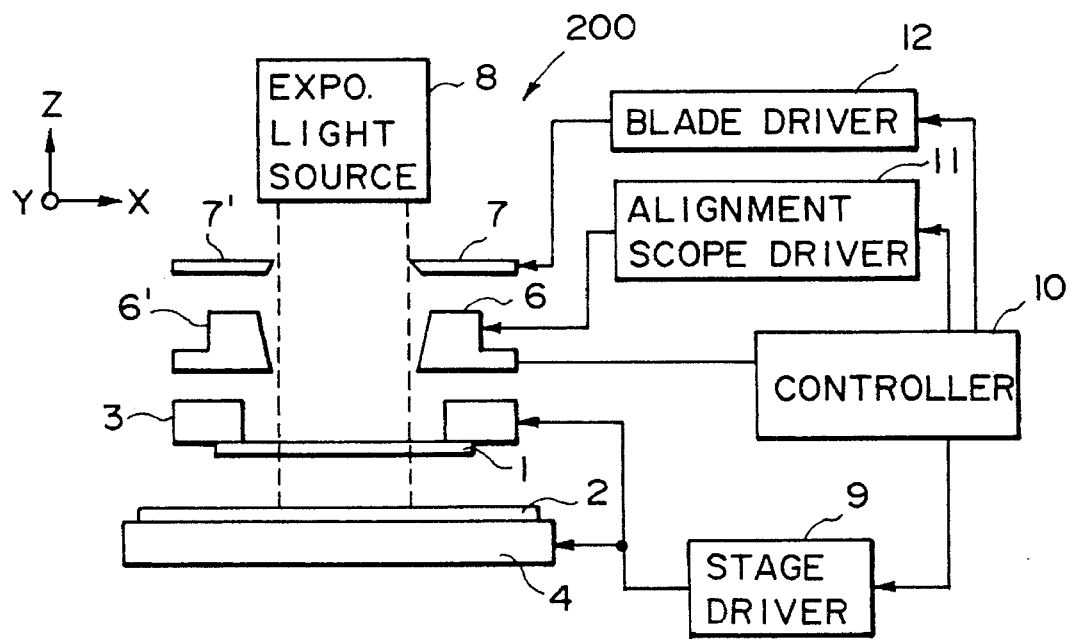

Referring now to FIGS. 1A and 1B showing one preferred form of the present invention, FIG. 1A illustrates a step-and-repeat type exposure apparatus 100 having an exposure range or zone (per one shot), upon a wafer 2, of a size of about 15–20 mm square, for example. Mask 2 is formed with a pattern prepared for manufacturing semiconductor devices, and this pattern is projected through the exposure range upon the wafer 2 by a reduction projection lens 5, in a predetermined reduced scale. The wafer 2 is held by a stage 4 which is movable stepwise by a predetermined distance in the X or Y direction each time the mask is illuminated with exposure light from an exposure light source 8 and, thus, the pattern of the mask 1 is printed on the wafer with the exposure light passing through the reduction projection lens 5. In this manner, the pattern of the mask 1 is printed on different shot areas on the wafer 2, sequentially. The exposure light source 8 of the exposure apparatus 100 supplies ultraviolet light such as g-line light, i-line light, excimer laser light or the like. The exposure light from the source 8 is directed to masking blades 7 - 7' by which the range of illumination to the mask 1 is restricted. After this, the light impinges on the mask 1 which is held by a mask stage 3.

Alignment scopes 6 - 6' are provided to detect the relative position of alignment patterns, provided on the mask 1 and the wafer 2, with respect to the X and Y directions, through the cooperation of the reduction projection lens 5. The result of the detection is supplied to a controller 10. In response, the controller 10 calculates any positional error between the mask 1 and the wafer 2 with respect to the X and Y directions as well as any rotational error therebetween about the Z axis. Additionally, through a stage driver 9, the controller 10 controls the position of the mask stage 3 and/or the wafer stage 4 so as to correct these errors. Further, by using a measurement signal supplied from a measuring device (not shown), the controller 10 calculates the position of the wafer 2 in the Z direction as well as rotational errors (tilt) thereof about the X and Y axes. Similarly, through the stage driver 9, the controller controls the position of the mask stage 3 and/or the wafer stage 4 to adjust the wafer position.

After these adjustments, the exposure source 8 starts irradiation of exposure light and, after exposure through a predetermined period is effected, the exposure process is finished. After this, the stage 4 moves stepwise as described so as to place the next shot area of the wafer 2 in the exposure range, and similar operations are repeated.

FIG. 1B illustrates a step-and-repeat type exposure apparatus 200 having an exposure range or zone (per one shot), upon the wafer 2, of a size of about 30 mm square, for example. Mask 1 is formed with a pattern prepared for manufacture of semiconductor devices, and this pattern is projected through the exposure range upon the wafer 2 at a unit magnification, wherein the wafer 2 is disposed opposed to and close to the mask 1. The wafer 2 is held by a stage 4 which is movable stepwise by a predetermined distance in the X or Y direction each time the mask 1 is illuminated with exposure light from an exposure light source 8 and, thus, the pattern of the mask 1 is printed on the wafer 2 with the exposure light. In this manner, the pattern of the mask 1 is printed on different shot areas on the wafer 2, sequentially.

While the exposure light from the source 8 of the exposure apparatus 200 may be ultraviolet light such as g-line light, i-line light, excimer laser light or the like, preferably it comprises X-rays. The exposure light from the source 8 is directed to masking blades 7 - 7' by which the range of illumination to the mask 1 is restricted. After this, the light impinges on the mask 1 held by a mask stage 3. The masking blades 7 - 7' of the exposure apparatus 200 are movable along an X-Y plane, by means of a blade driver 12, such that the range through which the exposure light passes can be changed as desired.

Alignment scopes 6 - 6' are provided to detect the relative position of alignment patterns of the mask 1 and the wafer 2, with respect to the X, Y and Z directions. The result of the detection is supplied to a controller 10. In response, the controller 10 calculates any positional error between the mask 1 and the wafer 2 with respect to the X and Y directions, any error in the interval between them along the Z direction as well as rotational errors about the X, Y and Z axes. Through a stage driver 9, the controller 10 controls the position of the mask stage 3 and/or the wafer stage 4 so as to correct these errors. The alignment scopes 6 - 6' of the exposure apparatus 200 are movable along the X-Y plane by means of an alignment scope driver 11, and therefore, any position within the exposure range can be observed through the alignment scope. Further, the controller 10 supplies drive instruction signals to the blade driver 12 and the alignment scope driver 11.

After the position and interval adjustment made under the influence of the controller 10, the exposure source 8 starts irradiation of exposure light. After the exposure through a predetermined period is effected, the exposure process is finished. Then, the stage 4 moves stepwise as described, so as to place the next shot area of the wafer 2 in the exposure range, and similar operations are repeated.

Figure 2:
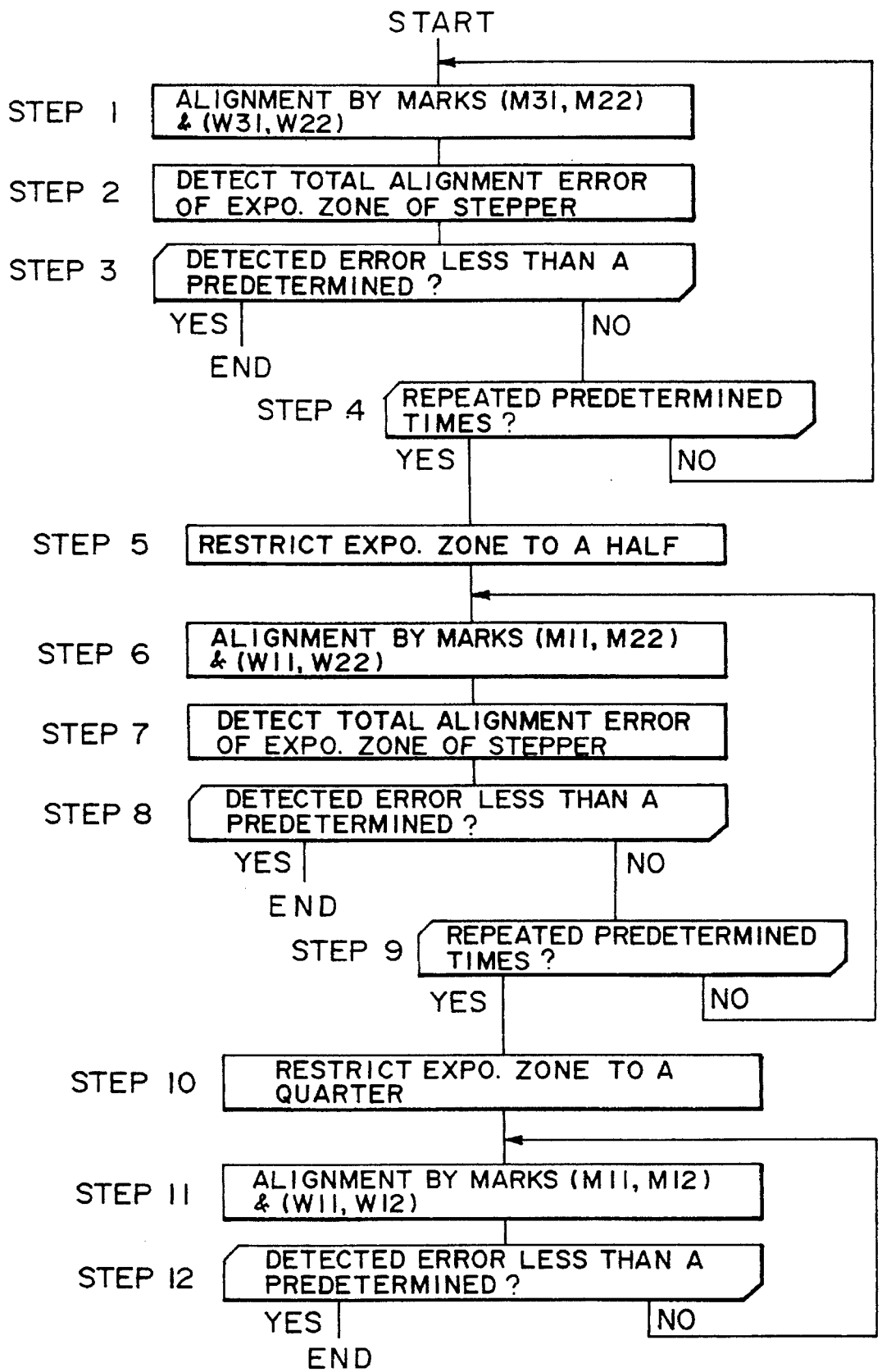
FIG. 2 is a flow chart showing sequential operations in an exposure method according to an embodiment of the present invention.

One preferred embodiment of the present invention will now be explained with reference to the flow chart of FIG. 2. This embodiment pertains to an alignment process on an occasion when the exposure apparatus 100 having an exposure range of 15 mm square is used to execute pattern printing and then the exposure apparatus 200 having an exposure range of 30 mm square is used to execute superposed printing of a next pattern. It is assumed now that each semiconductor device has a size of 15 mm square and, therefore, the exposure range of the exposure apparatus 100 has the same size as that of one semiconductor chip.

In the following description, reference character M denotes an alignment pattern of a mask 1, and reference character W denotes an alignment pattern of a wafer 2. The suffixes denote the order of disposition of semiconductor chips and alignment patterns. For example, reference character W21 denotes a first alignment pattern of a second semiconductor chip of the wafer 2, and reference character M21 denotes an alignment pattern of the mask 1 corresponding to that alignment pattern. The patterns already formed on the wafer 2 are those having been printed thereon by using the exposure apparatus 100.

In the exposure apparatus 200, at step 1, the alignment system comprising the alignment scopes 6 - 6' the controller 10, the stage driver 9 and the like, is used to execute the mask-to-wafer alignment with respect to the mask alignment patterns M31 and M22 (FIG. 8B) and the wafer alignment patterns W31 and W22 (FIG. 8A). Use of these marks is merely an example, and any other alignment patterns may be used. At step 2, for each of the zones (shot areas) #1–#4 of the wafer, i.e., for each semiconductor chip, an alignment error E1, E2, E3 or E4 is detected and, from the detected alignment errors E1–E4, an overall alignment error E throughout the current exposure range of the exposure apparatus 200 is determined. In this case, therefore, the alignment precision with regard to each semiconductor chip as well as the overall alignment precision throughout the exposure range of the second exposure apparatus can be detected. This will be explained later in greater detail, with reference to FIG. 5.

At step 3, discrimination is made as to whether the detected alignment error E is less than a predetermined error or not. If the result is affirmative, the alignment process is finished, and the exposure process of the wafer 2 with the exposure light from the source 8 starts. If the alignment error is not less than the predetermined, through step 4 the above-described operations are repeated by a predetermined number of times. The number of repetitions is determined in accordance with required precision, throughput and the like. If desired alignment precision E is not obtainable even after repetitions of the alignment process, the sequence goes to step 5 whereat the masking blades 7 - 7' are actuated by the blade driver 11 so as to restrict the exposure range to a half. The wafer and mask patterns on an occasion when the exposure range is restricted to a half, are illustrated in FIGS. 3A and 3B.

At step 6, similar to step 1, the alignment system is used to execute the mask-to-wafer alignment with respect to the mask alignment patterns M11 and M22 and the wafer alignment patterns W11 and W22. Use of these marks is merely an example, and any other alignment patterns may be used. At step 7, for each of the zones (shot areas) #1 and #2 of the wafer, i.e., for each semiconductor chip included within the current exposure range of the exposure apparatus 200, being restricted to a half, an alignment error E1 or E2 is detected and, from the detected alignment errors E1 and E2, the overall alignment error E throughout the half exposure range of the exposure apparatus 200 is determined.

At step 8, discrimination is made as to whether the alignment error E is less than a predetermined error or not. If so, the alignment process is finished and the exposure process is executed with regard to the exposure range restricted to a half. If not so, the above-described operations are repeated by a predetermined number of times. The number of repetitions is determined in accordance with required precision, throughput and the like. If desired alignment precision is not obtainable after the repetitions by a predetermined number of times, at step 10 the exposure range is further restricted to a quarter of the original exposure range. The wafer and mask patterns as the exposure range is restricted to a quarter, are illustrated in FIGS. 4A and 4B.

At step 11, similar to step 1, the alignment system is used to execute the mask-to-wafer alignment with respect to the mask alignment patterns M11 and M12 and the wafer alignment patterns W11 and W12. In this case, the exposure range of the exposure apparatus 200 has the same size as that of the exposure apparatus 100, namely, that of each semiconductor chip. Accordingly, the inconveniences resulting from the difference in the exposure range are removed.

At step 12, discrimination is made as to whether the alignment error is less than a predetermined error. If so, the alignment process is finished and the exposure process starts. If not so, the above-described operations are repeated.

In the foregoing case, the exposure range is restricted to a half and then to a quarter, sequentially. However, the step of restriction to a half may be omitted, and the exposure range may be restricted directly to a quarter. This can be determined in accordance with required precision, throughput and the like.

Figure 5:
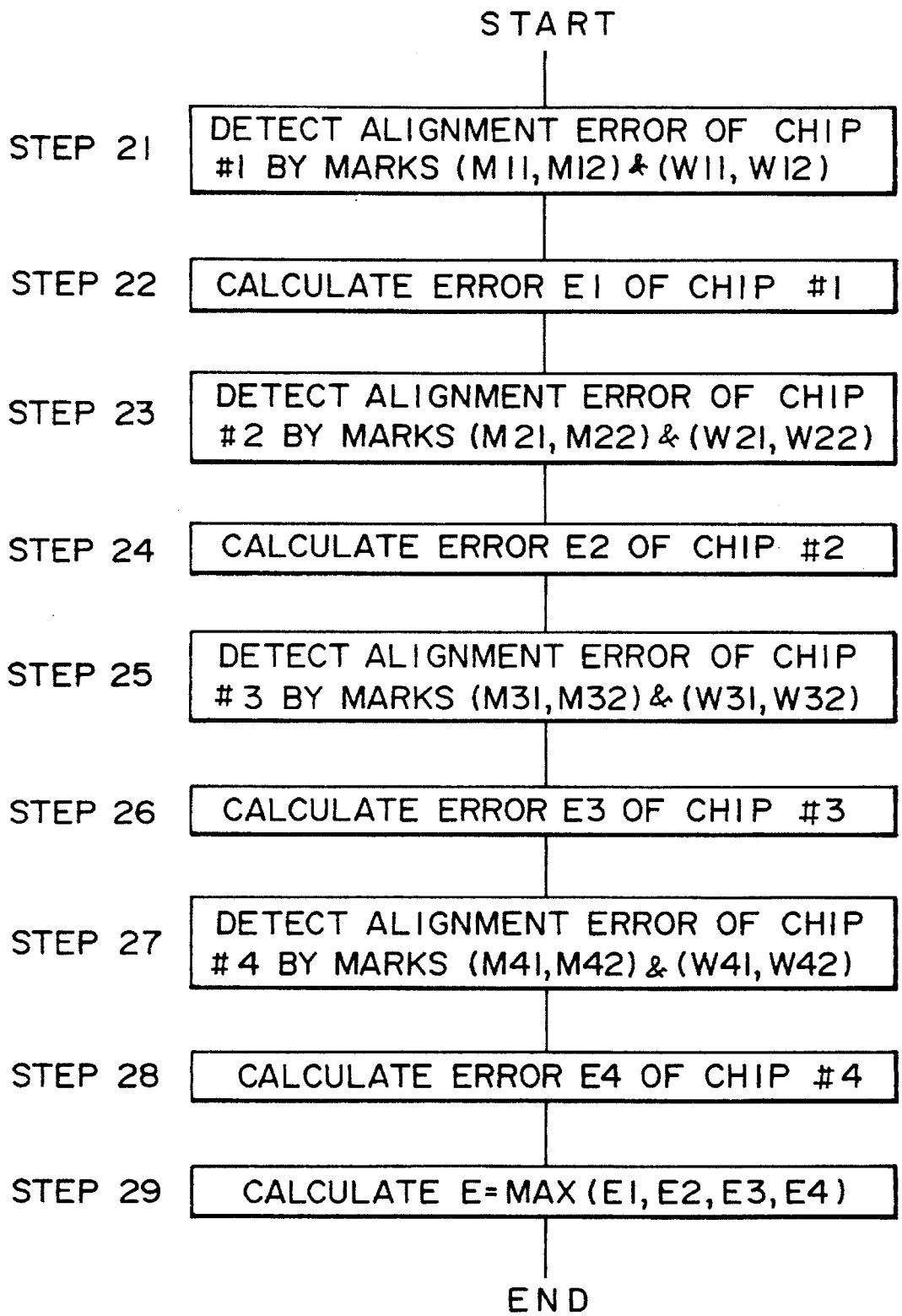
FIG. 5 is a flow chart, for explaining the manner of detecting an overall alignment error with respect to the whole exposure range of the second exposure apparatus.

Referring to FIG. 5, details of the manner of determining an alignment error E throughout the exposure range of the second exposure apparatus, from alignment errors E1–E4 of the zones #1–#4 of the wafer, having been exposed with the exposure apparatus 100, will be explained.

Figure 6:
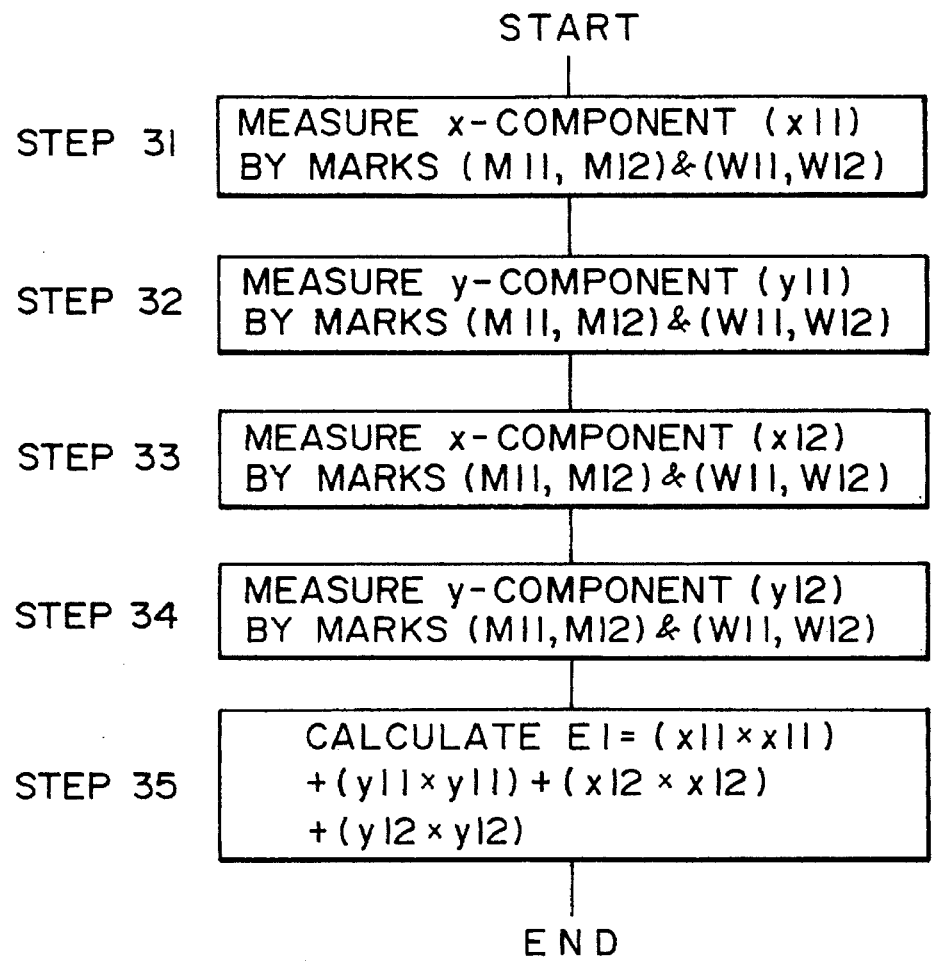
FIG. 6 is a flow chart, for explaining the manner of detecting an alignment error of each chip in the second exposure apparatus.

At step 21, an alignment error of a semiconductor chip #1 is measured and, at step 22, the error E1 of the semiconductor chip #1 is calculated. FIG. 6 is a flow chart showing details of such measurement and calculation.

At steps 31 and 32, with respect to an alignment pattern W11 at a lower left part of the semiconductor chip #1 and an alignment pattern M11 of the mask 1 opposed to the alignment pattern W11, an X-axis (horizontal component) X11 and a Y-axis component Y11 of the alignment error between these alignment patterns are measured.

At steps 33 and 34, with regard to an alignment pattern W12 at an upper right part of the semiconductor chip #1 and an alignment pattern M12 of the mask 1 opposed thereto, an X-axis (horizontal) component X12 and a Y-axis component y12, in a direction perpendicular to the X axis, of the alignment error between these alignment patterns, are measured.

At step 35, the squares of these error components, respectively, are totaled, and the sum is used as the alignment error E1 of the semiconductor chip #1.

Referring back to FIG. 5, at steps 23–28, alignment errors E2, E3 and E4 are detected with regard to the semiconductor chips #2, #3 and #4, in a similar manner as the semiconductor chip #1.

At step 29, the largest of the alignment errors E1–E4 of four semiconductor chips is detected. The largest one is used as the overall alignment error E for the four semiconductor chips, namely, throughout the exposure range of the second exposure apparatus. To this alignment error E detected in such a manner, the discrimination at step 3 in FIG. 2 is executed as described hereinbefore. At step 8, the number of chips to which the alignment error E calculation is to be made, is reduced to two, from four.

Next, another preferred embodiment of the present invention will be explained with reference to the flow chart of FIG. 9. This embodiment pertains to a process of adjusting the interval between a mask 1 and a wafer 2 in the Z direction, on an occasion when the exposure apparatus 100 having an exposure range of a size of 15 mm square is used to execute the pattern printing and, then, the second exposure apparatus 200 having an exposure range of a size of 30 mm square is used to superposedly print a next pattern on the wafer. Here, it is assumed that each semiconductor device has a size of 15 mm square. Thus, the size of the exposure range of the exposure apparatus 100 is equal to that of each semiconductor chip.

Reference character M denotes an M/W interval adjustment pattern of the mask, and reference character W denotes an M/W interval adjustment pattern of the wafer. The suffixes denote the order of disposition of semiconductor chips and that of M/W interval adjustment patterns.

For example, reference character W21 denotes a first M/W interval adjustment pattern of a second semiconductor chip of the wafer 2, and reference character M21 denotes an M/W interval adjustment pattern of the mask corresponding to that adjustment pattern.

At step 101, an interval adjustment system comprising, for example, the alignment scopes 6 - 6', the stage driver 9, the controller 10 and the like, is used to execute the mask-to-wafer interval adjustment process, with respect to the M/W interval adjustment patterns M31, M22 and M43 of the mask and the M/W adjustment patterns W31, W22 and W43 of the wafer. Use of the patterns M31, M22, M43; W31, W22 and W43 is merely an example, and any other M/W interval adjustment patterns may be used.

At step 102, for each of the zones (shot areas) of the wafer, i.e., for each semiconductor chip, an M/W interval adjustment error E1, E2, E3 or E4 is detected and, from the detected errors E1–E4, an overall M/W interval adjustment error E throughout the exposure range of the second exposure apparatus 200 is determined. In this case, therefore, the M/W interval adjustment error of each semiconductor chip as well as the overall M/W interval adjustment error throughout the exposure range of the exposure apparatus 200 can be detected. This will be described later in greater detail.

At step 103, discrimination is made as to whether the M/W interval adjustment error E is less than a predetermined error. If so, the interval adjustment process is finished and the exposure process starts by use of the exposure light from the source 8. If not so, the above-described steps 101–103 are repeated by a predetermined number of times (step 104). The number of repetitions is determined in accordance with required precision, throughput and the like. If desired interval adjustment precision is not obtainable as a result of repetitions of the predetermined number, at step 105, the masking blades 7 - 7' are displaced along the X-Y plane by the blade driver 12 so as to restrict the exposure range of the exposure apparatus 200 to a half.

Figure 10A:
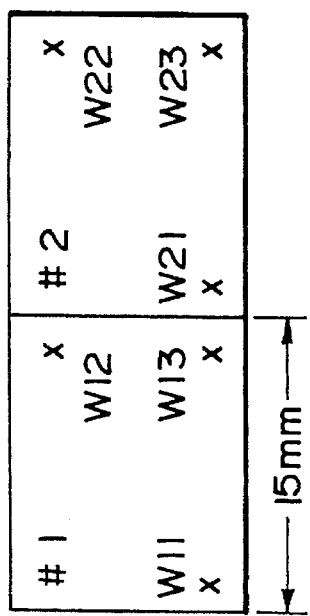
FIGS. 10A and 10B are schematic representations of wafer and mask patterns, on an occasion when in the FIG. 9 embodiment the exposure range of the second exposure apparatus is restricted to a half.
Figure 10B:
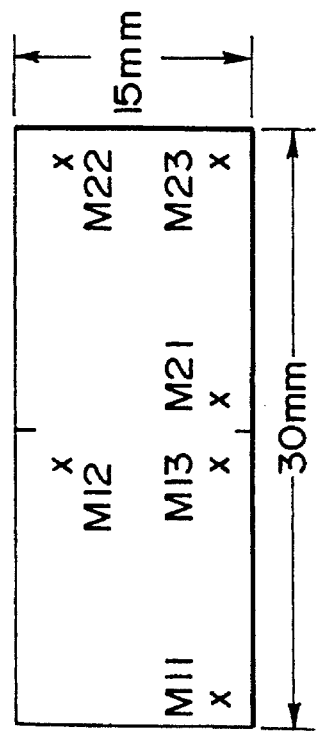

The wafer and mask patterns as the exposure range is restricted to a half, are illustrated in FIGS. 10A and 10B.

At step 106, similar to step 101, the interval adjustment system is used to execute the mask-to-wafer interval adjustment process, with respect to M/W interval adjustment patterns M11, M22 and M23 of the mask 1 and M/W interval adjustment patterns W11, W22 and W23 of the wafer 2. Use of the patterns M11, M22, M23; W11, W22 and W23 is merely an example, and any other M/W interval adjustment patterns may be used. At step 107, for each of the zones of the wafer included in the restricted exposure range, i.e., for each semiconductor chip, an M/W interval adjustment error E1 or E2 is detected and, from the detected errors E1 and E2, an overall M/W interval adjustment error E throughout the exposure range of the exposure apparatus 200, being restricted to a half, is determined.

Figure 11A:
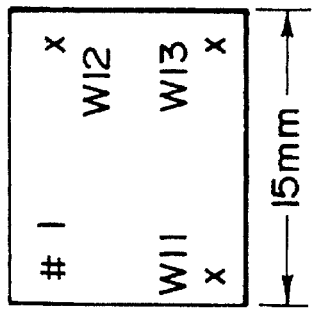
FIGS. 11A and 11B are schematic representations of wafer and mask patterns, on an occasion when in the FIG. 9 embodiment the exposure range of the second exposure apparatus is restricted to a quarter.
Figure 11B:
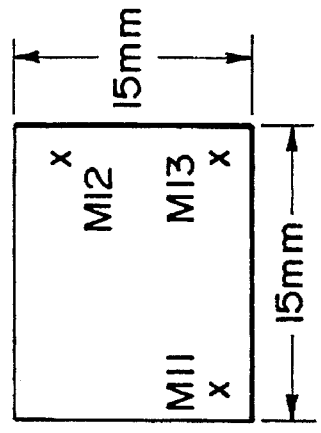

At step 108, discrimination is made as to whether the obtained M/W interval adjustment error E is less than a predetermined error. If so, the interval adjustment process is finished and the exposure process starts. If not so, at step 109, the above-described operations are repeated by a predetermined number of times. The number of repetitions is determined in accordance with required precision, throughput and the like. If desired M/W interval adjustment precision is not obtainable as a result of repetitions of the predetermined number, at step 110, the exposure range of the exposure apparatus 200 is restricted to a quarter of the original. The wafer and mask patterns as the exposure range is restricted to a quarter, are illustrated in FIGS. 11A and 11B.

At step 111, similarly to step 101, the interval adjustment system is used to execute the mask-to-wafer interval adjustment process with respect to the M/W interval adjustment patterns M11, M12 and M13 of the mask 1 and the M/W interval adjustment patterns W11, W12 and W13 of the wafer 2. In this case, the exposure range of the exposure apparatus 200 has the same size as that of the exposure apparatus 100, namely, that of each semiconductor chip. Accordingly, the inconveniences resulting from the difference in size of the exposure range are removed.

At step 112, discrimination is made as to whether the detected M/W interval adjustment error is less than a predetermined error. If so, the interval adjustment process is finished and the exposure process starts. If not so, the above-described operations are repeated.

While in the foregoing example, the exposure range of the exposure apparatus 200 is restricted to a half and then to a quarter, the step of restriction to a half may be omitted and the exposure range may be restricted directly to a quarter. This may be determined in accordance with required precision, throughput and the like.

Figure 12:
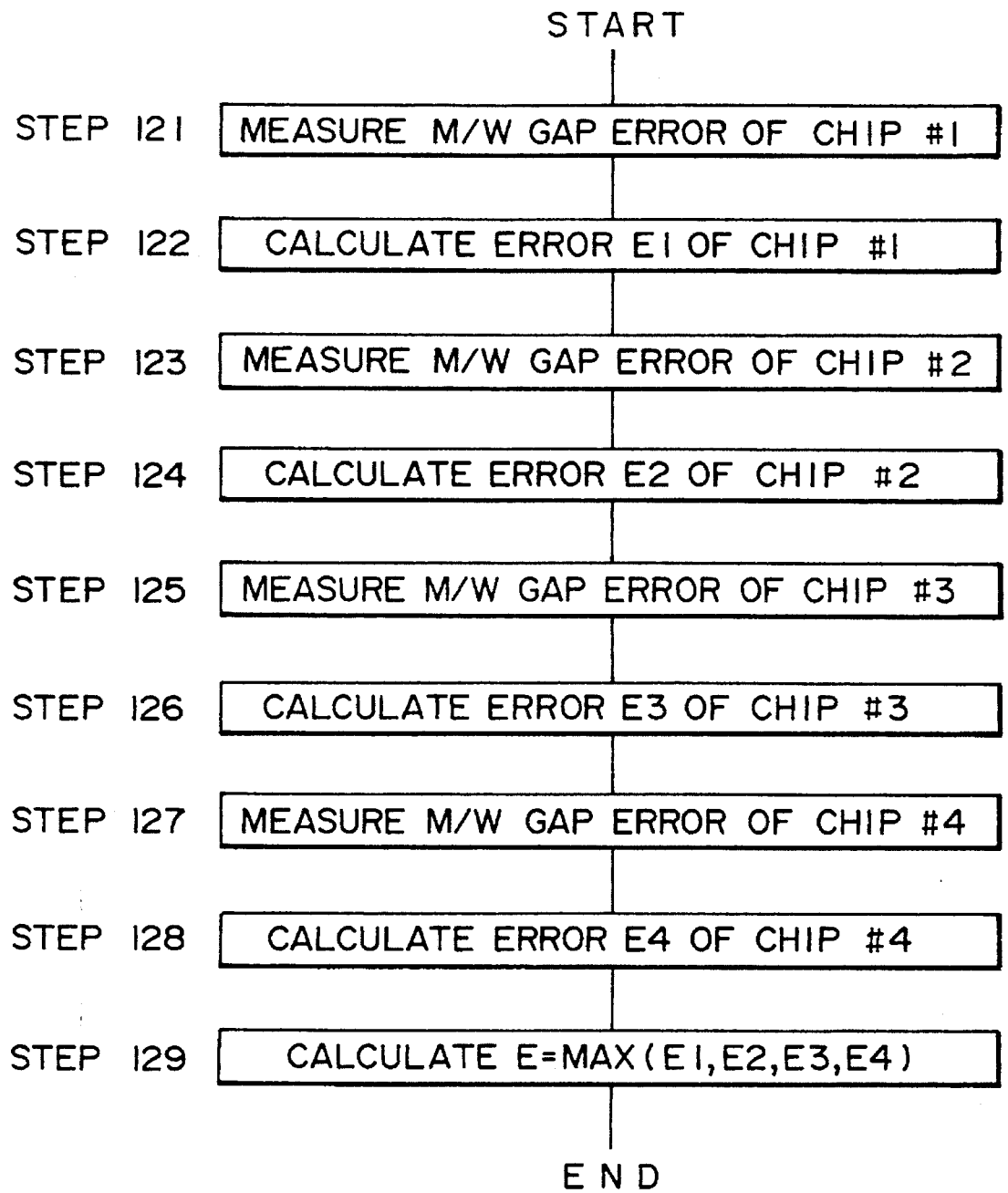
FIG. 12 is a flow chart, for explaining the manner of detecting an overall mask-to-wafer spacing adjustment error with respect to the whole exposure range of the second exposure apparatus.

Referring now to FIG. 12, details of the manner of detecting the overall M/W interval adjustment error E throughout the exposure range of the exposure apparatus 200, from the M/W interval adjustment errors E1–E4 of the four zones of the wafer, namely, the four semiconductor chips, will be explained.

At step 121, an M/W interval adjustment error of the semiconductor chip #1 is measured and at step 122, the error E1 of the semiconductor chip #1 is calculated.

Figure 13:
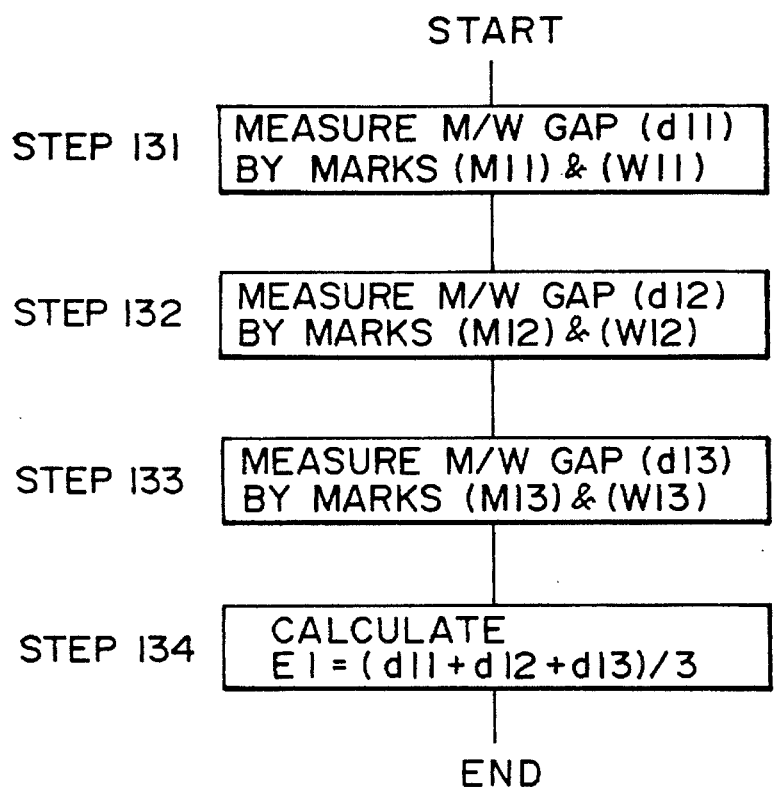
FIG. 13 is a flow chart, for explaining the manner of detecting a mask-to-wafer spacing adjustment error for each chip in the second exposure apparatus.

FIG. 13 is a flow chart, illustrating details of such measurement and calculation.

At step 131, by using an M/W interval adjustment pattern W11 at a lower left part of the semiconductor chip #1 and a corresponding adjustment pattern M11 of the mask 1, an M/W interval adjustment error d11 is measured.

At step 132, by using an M/W interval adjustment pattern W12 at an upper right part of the semiconductor chip #1 and a corresponding pattern M12 of the mask 1, an M/W interval adjustment error d12 is measured.

At step 133, by using an M/W interval adjustment pattern W13 at the lower right part of the semiconductor chip #1 and a corresponding pattern M13 of the mask 1, an M/W interval adjustment error d13 is measured.

At step 134, an average of these error components d11, d12 and d13 is calculated, and the obtained average is used as the M/W interval adjustment error E1 of the semiconductor chip #1.

Referring back to FIG. 4, at steps 123–128, M/W interval adjustment errors E2, E3 and E4 are detected with regard to semiconductor chips #2, #3 and #4, in a similar manner as in the semiconductor chip #1.

At step 129, the largest of the M/W interval adjustment errors E1–E4 of the four semiconductor chips is detected. The largest one is used as the overall M/W interval adjustment error E of the four semiconductor chips, namely, throughout the exposure range of the exposure apparatus 200. Then, discrimination is made at step 103. The remaining portion is essentially the same as that of the preceding embodiment.

As described hereinbefore, with the method of the present invention, even when exposure apparatuses having different exposure ranges are used in combination, the alignment errors and/or the M/W interval adjustment errors of all the semiconductor devices (chips) can be minimized. As a result, it is possible to ensure increased yield. Further, it is possible to provide semiconductor device manufacturing processes in which, by use of exposure apparatuses having different exposure ranges in combination, optimization is made with respect to the minimum linewidth, the productivity, the alignment precision and the like.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing method, comprising the steps of:

providing an optical exposure apparatus having a first exposure field, the optical exposure apparatus being operable to transfer a pattern of a first mask onto different shot areas of a semiconductor substrate in sequence and on a reduced scale;

providing an X-ray exposure apparatus having a second exposure field larger than the first exposure field, the X-ray exposure apparatus being operable to transfer a pattern of a second mask onto different shot areas, within the second exposure field, of a semiconductor substrate simultaneously and in a unit magnification;

transferring, through the optical exposure apparatus, the pattern of the first mask onto plural shot areas of a particular semiconductor substrate;

placing, after said transferring step, the particular semiconductor substrate in the X-ray exposure apparatus;

detecting positional errors of those shot areas covered by the second exposure field with respect to the pattern of the second mask;

calculating an overall positional error within the range of the second exposure field, on the basis of the detected positional errors;

reducing the second exposure field when the calculated overall positional error is not less than a predetermined error, so as to reduce the number of shot areas to be covered by the second exposure field; and transferring, through the X-ray exposure apparatus, the pattern of the second mask onto those shot areas to which the pattern of the first mask has been transferred.

2. A method according to claim 1, wherein the positional error comprises an error between a shot area of the particular semiconductor substrate and the pattern of the second mask with respect to a direction along the shot area.

3. A method according to claim 1, wherein the positional error comprises an error between a shot area of the particular semiconductor substrate and the pattern of the second mask with respect to a direction along which the particular semiconductor substrate and the second mask are opposed to each other.

4. A method according to claim 1, wherein said step of reducing of the second exposure field comprises the step of moving a blade member which defines the range of irradiation of X-rays.

5. A method according to claim 1, wherein the optical exposure apparatus comprises a generating source for generating UV light.

6. A method according to claim 1, wherein the X-ray exposure apparatus comprises a generating source for generating synchrotron radiation.

7. A method according to claim 1, wherein the first mask comprises one chip pattern and an alignment mark provided around the chip pattern.

8. A method according to claim 1, wherein the second mask comprises a plurality of chip patterns and a plurality of alignment marks each formed around a corresponding chip pattern.

9. A method according to claim 11, wherein said detecting step comprises detecting the relation between an alignment mark of a first mask, as transferred onto the shot area by the optical exposure apparatus, and an alignment mark of a second mask placed in the X-ray exposure apparatus, to thereby detect an alignment error.

10. A method according to claim 9, wherein the detection of the alignment error is performed for every shot area or every N shot areas, wherein N is an integer.

11. A semiconductor device manufacturing method, comprising the steps of:

providing an optical exposure apparatus operable to transfer a pattern of a first mask onto different shot areas of a semiconductor substrate in sequence and on a reduced scale;

providing an X-ray exposure apparatus operable to transfer a pattern of a second mask onto one or more shot areas of a semiconductor substrate simultaneously and in a unit magnification;

transferring, through the optical exposure apparatus, the pattern of the first mask onto plural shot areas of a particular semiconductor substrate;

placing, after said transferring step, the particular semiconductor substrate in the X-ray exposure apparatus;

detecting positional errors of those shot areas to which the pattern of the first mask has been transferred with respect to the pattern of the second mask;

determining the number of shot areas to which the pattern of the second mask is to be transferred simultaneously through the X-ray exposure apparatus, on the basis of the detected positional errors; and transferring, through the X-ray exposure apparatus, the pattern of the second mask onto those shot areas to which the pattern of the first mask has been transferred.

12. A method according to claim 11, wherein the positional error comprises an error between a shot area of the particular semiconductor substrate and the pattern of the second mask with respect to a direction along the shot area.

13. A method according to claim 11, wherein the positional error comprises an error between a shot area of the particular semiconductor substrate and the pattern of the second mask with respect to a direction along which the particular semiconductor substrate and the second mask are opposed to each other.

14. A method according to claim 11, wherein the optical exposure apparatus comprises a generating source for generating UV light.

15. A method according to claim 11, wherein the X-ray exposure apparatus comprises a generating source for generating synchrotron radiation.

16. A method according to claim 11, wherein the first mask comprises one chip pattern and an alignment mark provided around the chip pattern.

17. A method according to claim 11, wherein the second mask comprises a plurality of chip patterns and a plurality of alignment marks each formed around a corresponding chip pattern.

18. A method according to claim 11, wherein said detecting step comprises detecting the relation between an alignment mark of a first mask, as transferred onto the shot area by the optical exposure apparatus, and an alignment mark of a second mask placed in the X-ray exposure apparatus, to thereby detect an alignment error.

19. A method according to claim 18, wherein the detection of the alignment error is performed for every shot area or every N shot areas, wherein N is an integer.

20. A device manufacturing method comprising:

providing an optical exposure apparatus operable to transfer a pattern of a mask onto different shot areas of a substrate in sequence;

providing an X-ray exposure apparatus operable to transfer a pattern of a mask onto one or more shot areas of a substrate simultaneously;

transferring, by use of the optical exposure apparatus, a pattern of a first mask onto plural shot areas of a particular substrate;

placing, after said transferring step, the particular substrate in the X-ray exposure apparatus;

detecting positional errors of those shot areas of the particular substrate to which the pattern of the first mask has been transferred, with respect to a pattern of a second mask;

determining the number of shot areas to which the pattern of the second mask is to be transferred simultaneously with the X-ray exposure apparatus, on the basis of the detected positional errors; and transferring, with the X-ray exposure apparatus, the pattern of the second mask onto those shot areas of the particular substrate to which the pattern of the first mask has been transferred.

21. A set of masks for use in the manufacture of devices, comprising:

a first mask having a first pattern, for use in an optical exposure apparatus operable to transfer a pattern of a mask onto plural shot areas of a substrate in sequence; and a second mask having a second pattern, for use in an X-ray exposure apparatus operable to transfer a pattern of a mask onto one or more shot areas of a substrate simultaneously, wherein the first and second masks have alignment marks which are arranged for detection of positional errors of those shot areas of a particular substrate to which the first pattern of the first mask has been transferred with the optical exposure apparatus, with respect to the second pattern of the second mask, and which are also arranged for determination of the number of shot areas of the particular substrate to which the second pattern of the second mask is to be transferred simultaneously with the X-ray exposure apparatus, on the basis of the detected positional errors.

22. A set of masks according to claim 21, wherein the first mask has one chip pattern as the first pattern.

23. A set of masks according to claim 22, wherein the alignment mark of the first mask is formed around the chip pattern.

24. A set of masks according to claim 21, wherein the second mask has a plurality of chip patterns as the second pattern.

25. A set of masks according to claim 24, wherein the second mask has plural alignment marks each formed around a corresponding chip pattern.

* * * * *

UNITED STATES PATENT AND TRADEMARK OFFICE
CERTIFICATE OF CORRECTION

PATENT NO. : 5,498,501  Page 1 of 2
DATED : March 12, 1996
INVENTOR(S) : Isamu SHIMODA, et al.

It is certified that error appears in the above-indentified patent and that said Letters Patent is hereby corrected as shown below:

ON THE COVER PAGE:

IN THE ABSTRACT, item [57]:

Line 1, "of" (second occurrence) should be deleted.

IN THE DRAWINGS:

Sheet 11 of 11, FIG. 15A, "WAER" should read --WAFER--.

COLUMN 5:

Line 19, "mined," should read --mined error,--;
Line 27, "from" should read --form--; and
Line 45, "predetermined," should read --predetermined error,--.

UNITED STATES PATENT AND TRADEMARK OFFICE
CERTIFICATE OF CORRECTION

PATENT NO. : 5,498,501
DATED : March 12, 1996
INVENTOR(S) : Isamu SHIMODA, et al.

It is certified that error appears in the above-indentified patent and that said Letters Patent is hereby corrected as shown below:

COLUMN 7:

Line 65, "predetermined," should read --predetermined error,--.

COLUMN 12:

Line 49, "claim 11," should read --claim 1,--.

Signed and Sealed this

Twenty-third Day of July, 1996

BRUCE LEHMAN

*Attest:*

*Attesting Officer*     *Commissioner of Patents and Trademarks*